United States Patent [19]
Chang et al.

[11] Patent Number: 5,266,446
[45] Date of Patent: Nov. 30, 1993

[54] METHOD OF MAKING A MULTILAYER THIN FILM STRUCTURE

[75] Inventors: Kenneth Chang, Hopewell Junction; George Czornyj, Poughkeepsie; Mukta Shaji Farooq; Ananda H. Kumar, both of Hopewell Junction; Marvin S. Pitler, late of Poughkeepsie, N.Y., by Peter L. Maroulis, executor; Heinz O. Steimel, Fishkill, all of N.Y.

[73] Assignee: International Business Machines Corporation, Armonk, N.Y.

[21] Appl. No.: 890,331

[22] Filed: May 26, 1992

Related U.S. Application Data

[63] Continuation of Ser. No. 613,196, Nov. 15, 1990, abandoned.

[51] Int. Cl.$^5$ .................. G03C 5/00; H01L 21/283
[52] U.S. Cl. ................................ 430/314; 430/313; 430/315; 430/317; 156/643; 437/183; 437/203; 437/225; 437/228; 437/229
[58] Field of Search ............. 430/311, 313, 314, 315, 430/317, 319, 320, 322, 324, 331; 156/643, 659.1, 661.1; 437/187, 203, 225, 228, 229

[56] References Cited

U.S. PATENT DOCUMENTS

| | | | |
|---|---|---|---|
| 4,451,326 | 5/1984 | Gwozdz | 430/317 |
| 4,572,764 | 2/1986 | Fan | 430/315 |
| 4,622,058 | 11/1986 | Leary-Renick et al. | 65/105 |
| 4,631,111 | 12/1986 | Williston | 146/630 |
| 4,789,648 | 12/1988 | Chow et al. | 437/225 |
| 4,816,115 | 3/1989 | Horner et al. | 430/317 |
| 4,944,836 | 7/1990 | Beyer et al. | 156/645 |
| 5,091,339 | 2/1992 | Carey | 437/187 |

FOREIGN PATENT DOCUMENTS

| | | |
|---|---|---|
| 0190490 | 11/1985 | European Pat. Off. . |
| 0211180 | 6/1986 | European Pat. Off. . |
| 0238118 | 2/1987 | European Pat. Off. . |
| 2137902 | 5/1971 | France . |
| 2602947 | 7/1987 | France . |

OTHER PUBLICATIONS

Shaw, et al., Entitled "Photosensitive Glass for Producing Recessed Metallurgy, Eliminating Need for Planarazation", IBM Technical Disclosure Bulletin, vol. 26, No. 3A, p. 1094 (Aug. 1983).

Primary Examiner—Marion E. McCamish
Assistant Examiner—Kathleen Duda
Attorney, Agent, or Firm—Ira David Blecker

[57] ABSTRACT

A method of making a multilayer thin film structure on the surface of a dielectric substrate which includes the steps of:
a. forming a multilayer thin film structure including the steps of:
   applying a first layer of dielectric polymeric material on the surface of a dielectric substrate,
   applying a second layer of dielectric polymeric material over the first layer of polymeric material wherein the second polymeric material is photosensitive,
   imagewise exposing and developing the second polymeric material to form a feature therein, the second layer feature in communication with at least one feature formed in the first polymeric material; and
b. filling the features in the entire multilayer structure simultaneously with conductive material.

Preferably, the first layer feature is a via and the second layer feature is a capture pad or wiring channel. Also disclosed is a multilayer thin film structure made by this method.

25 Claims, 4 Drawing Sheets

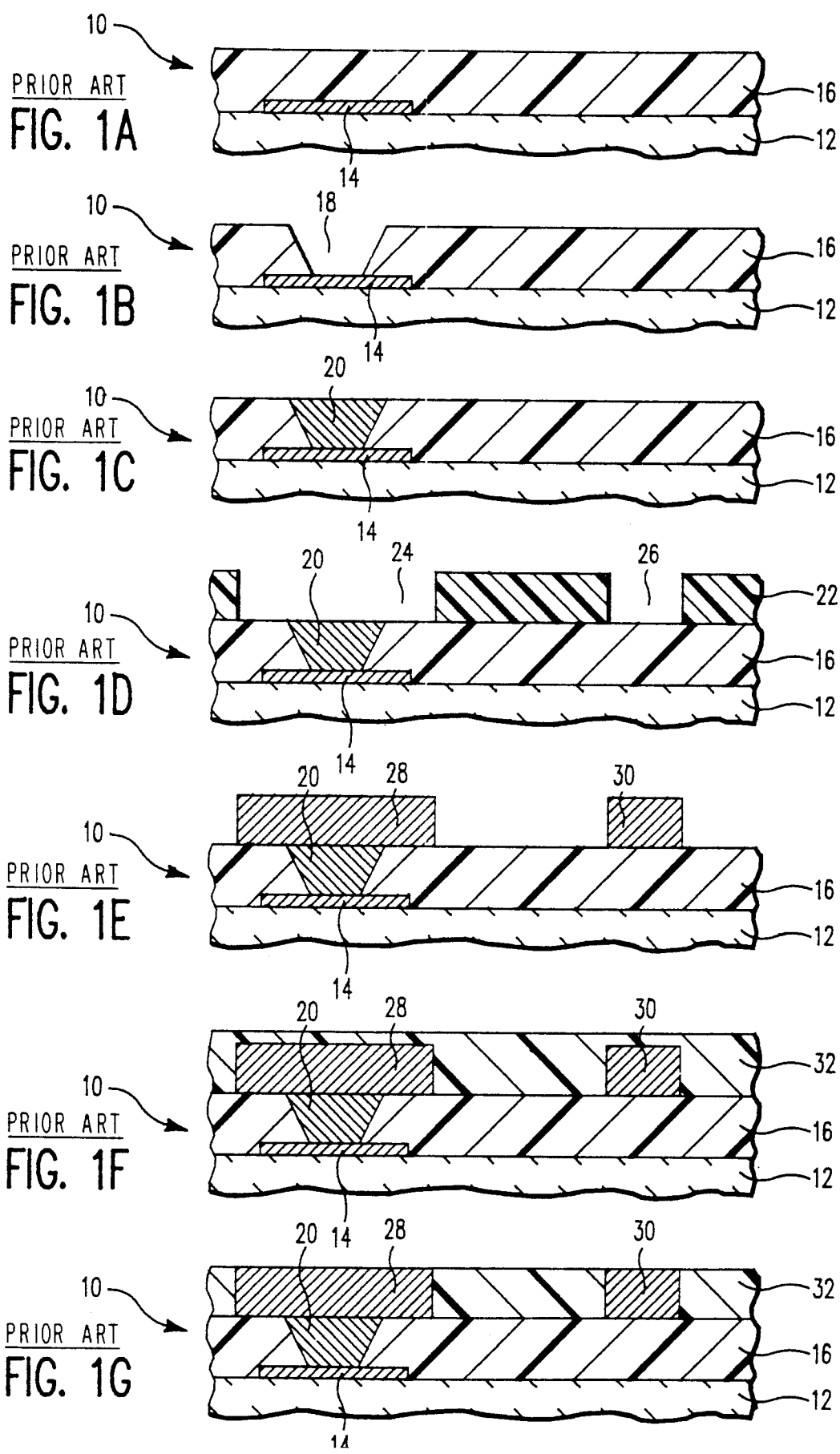

METHOD OF MAKING A MULTILAYER THIN FILM STRUCTURE

This application is a continuation, of application Ser. No. 07/613,196, filed Nov. 15, 1990, now abandoned.

BACKGROUND OF THE INVENTION

This invention relates to the field of microelectronics and semiconductor device packaging and, more particularly to multilayer thin film wiring structures having alternating layers of vias and custom wiring planes or other features such as capture pads, engineering change pads, etc.

In the field of microelectronic fabrication for computer applications, there is an ever increasing demand for faster components. The semiconductor devices, themselves, are being continuously upgraded to increase speed. However, it is estimated that one-half of the processing time is taken up in interconnection and power distribution circuitry. The delays encountered in the electronic package are therefore as critical to the overall performance time as are the device speeds.

The typical electronic package for high performance applications consists of a multilayer ceramic (MLC) substrate having semiconductor devices mounted on the top surface. The bottom surface of the substrate typically contains I/0 pins for connection to a card or board. It is well known that the processing delay inherent in the package can be significantly reduced by the use of thin film wiring structures on top of the MLC substrate.

Various techniques have been proposed for making these thin film wiring structures. What they all seem to have in common is that the conductive metallization is deposited a layer at a time. That is, a first layer containing a via is formed then a second layer containing a wiring line or capture pad in electrical contact with the via is formed. Such a layer by layer process raises severe continuity, reliability and yield concerns. Most importantly, the greatest disadvantage of the layer by layer process is the large number of processing steps which are necessary to lay down even a single thin film wiring layer. Indeed, the task of forming multilayer structures containing one or more thin film wiring layers by the layer by layer process is a formidable one.

Beyer et al. U.S. Pat. No. 4,944,836, the disclosure of which is incorporated by reference herein, is an example of the layer by layer process. In FIG. 4, a 3 layer structure is formed. Each layer is formed by depositing a dielectric layer, patterning a trench and then filling the trench with conductive material. The conductive material may be deposited by sputtering, chemical vapor deposition or electroplating. Thereafter, the layer is planarized by chemical-mechanical polishing techniques. The structure is now ready for the second layer to be formed.

A similar process is demonstrated in Shaw et al., "Photosensitive Glass For Producing Recessed Metallurgy, Eliminating Need For Planarization", IBM Technical Disclosure Bulletin, Vol. 26, No. 3A, p. 1094 (August 1983), the disclosure of which is incorporated by reference herein. This reference discloses the use of a photosensitive glass to form the pattern.

In Park, et al. U.S. patent application Ser. No. 399,058, filed Aug. 28, 1989, the disclosure of which is incorporated by reference herein, the single-layer pattern is formed in a photosensitive polyimide. Metal is deposited by suitable techniques (for example, vacuum deposition, electroplating, etc.) in the pattern and on the polyimide. The excess metal is removed by a machining-type planarization technique.

Leary-Renick U.S. Pat. No. 4,622,058, the disclosure of which is incorporated by reference herein, discloses another layer by layer process wherein each single layer comprises a glass which is then fired. The pattern, in this case step-shouldered vias, can be formed by ablating the glass. Thereafter, metal is deposited in the vias.

Chow et al. U.S. Pat. No. 4,789,648, the disclosure of which is incorporated by reference herein, discloses the formation of a dual via-wiring channel on a semiconductor device. This structure is formed by first depositing first and second insulation layers, for example quartz, and then etching a via in the first layer and a wiring channel in the second layer. The multilayered structure is metallized by a conformal metallization technique and then chem-mech polished.

Fan U.S. Pat. No. 4,572,764 and Williston U.S. Pat. 4,631,111, the disclosures of which are incorporated by reference herein, illustrate the formation of a multilayer structure using two layers of photosensitive polymeric material. In Fan, the two layers of polymeric material are imagewise exposed and developed separately while in Williston the two layers are imagewise exposed and developed simultaneously. In any event, the patterns so formed are then selectively metallized by electrolessly plating. A subsequent material removal process is not required since the pattern is not plated up to fill the depth of the pattern.

Notwithstanding the past efforts of those concerned with multilayered thin film structures, there still remains a need for an improved process for making such structures. This improved process should be characterized by reduced complexity and higher yields.

Accordingly, it is an object of the present invention to have an improved process for making multilayered thin film structures.

This and other objects of the invention will become more apparent after referring to the following description considered in conjunction with the accompanying drawings.

BRIEF SUMMARY OF THE INVENTION

The objects of the invention have been achieved by providing, according to one aspect of the invention, a method of making a multilayer thin film structure. The method comprises the steps of:

a. forming a multilayer thin film structure comprising the steps of:
   applying a first layer of dielectric polymeric material on a surface of a dielectric substrate,
   applying a second layer of dielectric polymeric material over the first layer of polymeric material wherein said second polymeric material is photosensitive,
   imagewise exposing and developing said second polymeric material to form a feature therein, said second layer feature in communication with at least one feature formed in said first polymeric material; and b. filling the features in the entire multilayer structure simultaneously with conductive material.

According to another aspect of the invention, there is disclosed a multilayer wiring structure which comprises:
a dielectric substrate;

a thin film multilayer structure on said substrate;
said thin film structure comprising:
a first layer of dielectric non-photosensitive polymeric material having a feature therein communicating with said dielectric substrate; and
a second layer of dielectric polymeric material over the first layer of polymeric material, said second layer of polymeric material being photosensitive and having a feature therein which is in communication with said first layer feature;
said first and second layer features simultaneously filled with conductive material so that an interface does not exist between the conductive material of each of said first and second layer features.

BRIEF DESCRIPTION OF THE DRAWINGS

FIGS. 1A-G are a schematical representation of a typical prior art method of manufacturing a multilayered thin film structure.

DETAILED DESCRIPTION OF THE INVENTION

Figure 2A:
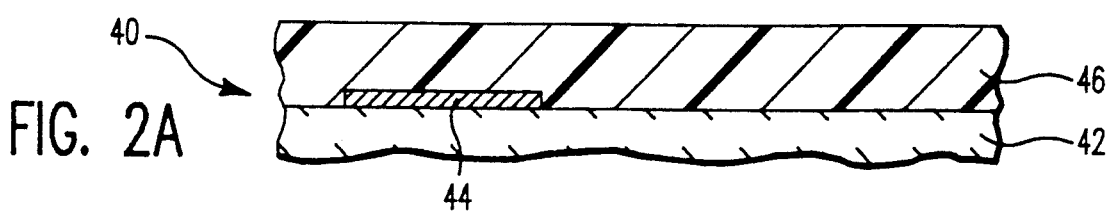
FIGS. 2A-E are a schematical representation of a method of manufacturing a multilayered thin film structure according to the invention.

Referring to the drawings in more detail and particularly referring to FIG. 1, there is schematically illustrated a prior art method of fabricating a multilayer thin film structure, generally indicated by 10. It is desired to build a thin film wiring level which, for example, may consist of a layer containing a via and a separate layer containing a wiring line.

In FIG. 1A, a multilayer ceramic (MLC) substrate 12 having a capture pad 14 is shown. Not shown is the via that would normally connect the capture pad to the internal wiring of the substrate. On top of substrate 12 is deposited a layer of insulative (dielectric) organic material 16. The organic material may be deposited by, for example, spraying or spinning. A typical organic material used is a polyimide.

After deposition of the organic material, the next step is to begin formation of the via. Thus, in FIG. 1B, the organic material is selectively removed over the capture pad to form an opening 18 for the via. A preferred method of material removal is by laser ablation with the aid of a dielectric mask. One can also utilize $O_2$ plasma etching techniques to accomplish the same objective.

Next, metal is deposited in the via, typically by a vapor deposition process. Since the vapor deposition process blanket deposits the metal on top of the organic material as well as in the via, a planarization step is necessary to remove the unwanted metal and, also, to get the structure ready for the next layer. Planarization is easily accomplished by, for example, chem-mech polishing. FIG. 1C shows the structure 10 after metal deposition and planarization, illustrating that only via 20 contains the deposited metal. Organic material 16 remains as part of the final structure.

It is now desired to form the wiring lines which will be accomplished by a liftoff structure. On top of organic material 16 is deposited a photoresist 22. Whether the photoresist is a negative or positive photoresist is unimportant. The photoresist is imagewise exposed and developed to form opening 24 in communication with via 20 and another opening 26 as can be seen in FIG. 1D. Each opening 24, 26 will eventually contain a separate wiring line.

Thereafter, metal is deposited (again, by vapor deposition) over the resist 22 and in openings 24, 26. The resist is "lifted off" along with the unwanted metal sitting on top of the resist, leaving wiring lines 28, 30 as shown on FIG. 1E.

As illustrated in FIG. 1F, a second layer 32 of insulative organic material is deposited (for example, by spraying or spinning) over the first layer of organic material 16 and wiring lines 28, 30.

Finally, the structure 10 is planarized by, for example, chem-mech polishing or by other planarizing techniques resulting in the structure shown in FIG. 1G.

As can be seen in this prior art method, each layer of metal is put down one layer at a time, thereby requiring metal deposition steps and planarization steps for each layer. It can be appreciated that it would be extremely desirable to eliminate at least some of the processing steps for such a thin film multilayer structure. The elimination of steps would be advantageous from the standpoint of reducing processing time and cost but also from the standpoint of increasing yield since each processing step typically has a yield of less than 100%.

The inventors of the present invention have discovered a methodology for producing a thin film multilayer structure with reduced processing steps, lower cost and higher yields.

Thus, according to the invention, there is disclosed a method of making a multilayer thin film structure on the surface of a dielectric substrate comprising the steps of:
a. forming a multilayer thin film structure comprising the steps of:
applying a first layer of dielectric polymeric material on a surface of a dielectric substrate,
applying a second layer of dielectric polymeric material over the first layer of polymeric material wherein said second polymeric material is photosensitive,
imagewise exposing and developing said second polymeric material to form a feature therein, said second layer feature in communication with at least one feature formed in said first polymeric material; and
b. filling the features in the entire multilayer structure simultaneously with conductive material.

The invention will become more apparent after referring to the Figures. One aspect of the invention is particularly disclosed in FIG. 2. It is desired to build a multilayer thin film structure on substrate 42, which may be a previous wiring level or a multilayer ceramic substrate. For purposes of illustration, and not limitation, it will be assumed hereafter that substrate 42 is a multilayer ceramic (MLC) substrate. The MLC substrate may be selected from a variety of materials including alumina, alumina plus glass, mullite, cordierite glass ceramic, borosilicate glass, etc.

On substrate 42, there is a capture pad 44 which would ordinarily connect to the internal wiring of the substrate through a via (not shown). On top of substrate 42 and capture pad 44, there is deposited (for example, by spraying or spinning) a first layer of insulative or dielectric polymeric material. This layer would then typically be planarized by a simple mechanical polishing process resulting in the structure shown in FIG. 2A.

Figure 2B:
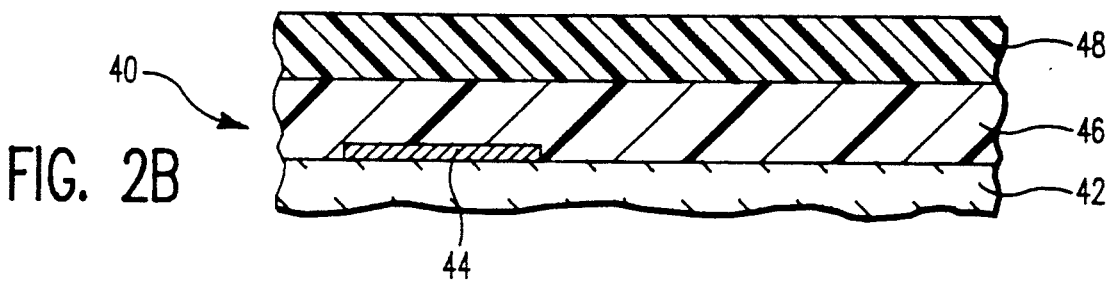

Next, a second layer 48 of dielectric polymeric material is deposited over the first layer 46 of polymeric material as shown in FIG. 2B. Second layer 48 of polymeric material, however, is photosensitive while first layer 46 in one embodiment of the invention is not photosensitive. Second layer 48 of polymeric material may also be planarized if desired.

Figure 2C:
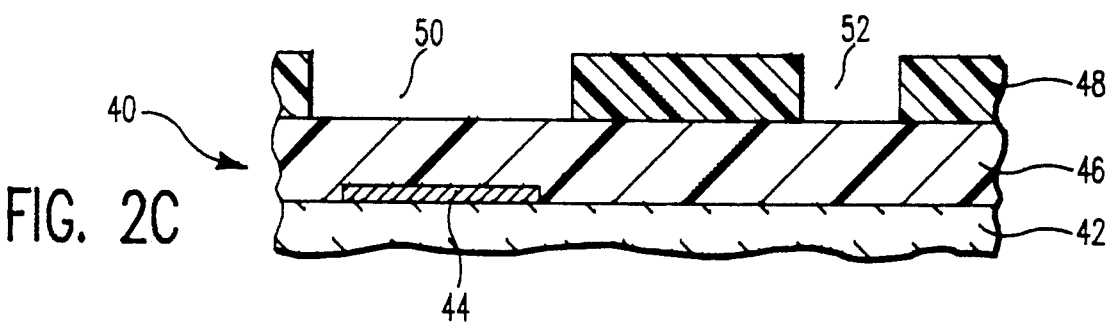

After imagewise exposing and developing the second layer 48 of polymeric material, the multilayer structure 40 shown in FIG. 2C is obtained. The multilayer structure 40 has openings or channels 50, for wiring lines although opening 50 instead may eventually contain a capture pad for another wiring level, an engineering change pad or a chip connection pad.

Figure 2D:
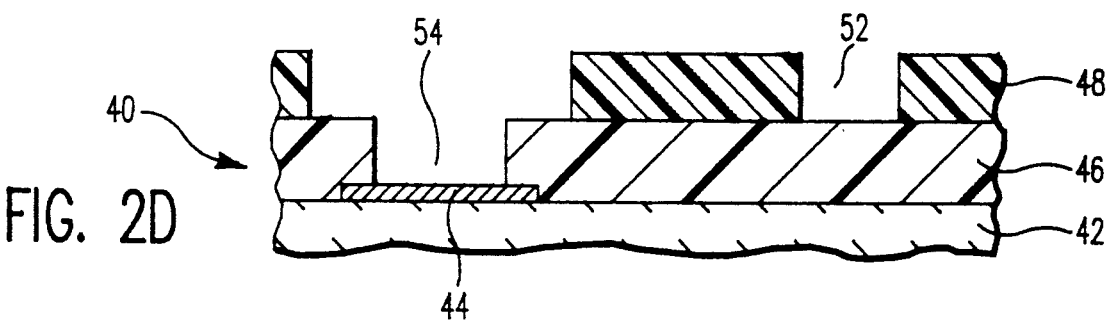

As shown in FIG. 2D, the first layer 46 of polymeric material has been altered to now contain a via opening 54 in communication with opening 50. Opening 54 may be formed by any suitable process but laser ablation using a dielectric mask such as that disclosed in U.S. patent application Ser. No. 924,480 filed Oct. 29, 1986, is preferred. Reactive ion etching is also possible.

Figure 2E:
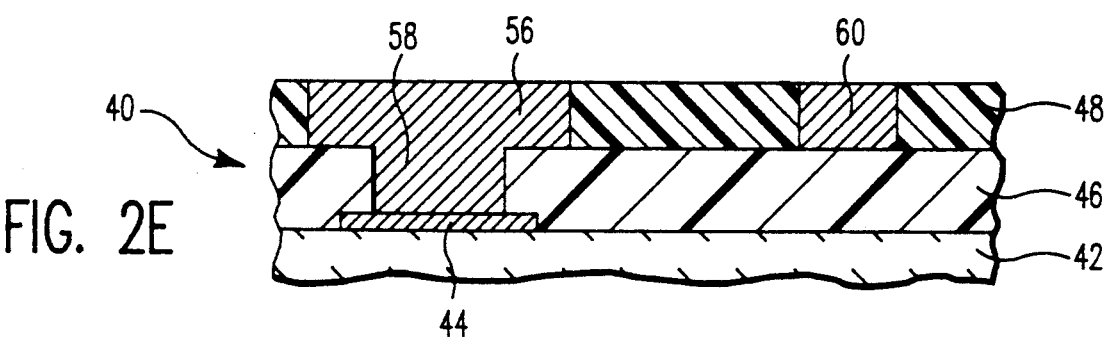

Finally, wiring line openings or channels 50, 52 and via opening 54 are filled with conductive material and then the structure 40 is planarized as illustrated in FIG. 2E. It is important to note that wiring line opening 50 and via opening 54 are simultaneously filled with conductive material so that an interface does not exist between wiring line 56 and via 58. That is, wiring line 56 and via 58 form an homogeneous or unitary mass. Of course, opening 52 is filled at the same time to form wiring line 60. The preferred method of filling and subsequent planarization will be discussed in more detail hereafter. Suffice it to say here that due to the fact that wiring line opening 50 and via opening 54 are filled simultaneously, there is a necessary reduction in processing steps among other advantages.

A variety of dielectric polymeric materials may be chosen for first layer 46 and second layer 48. Particularly preferred polymeric materials are the polyimides but other high temperature polymers having thermal stability, adhesion, dielectric constant and solvent resistance properties similar to polyimides are also suitable for purposes of the present invention.

Some of the polyimides useful in the present invention include the BPDA-PDA, BPDA-ODA and BTDA-ODA type polyimides. The polyimides may also be preimidized if desired. Esters of polyamic acid, for example of the PMDA-ODA type, are also suitable. For examples of the latter, see Diller et al. U.S. Pat. No. 4,849,501, the disclosure of which is incorporated by reference herein. Newer polyimides include fluorinated polyimides, silicon/polyimide copolymers and acetylene terminated polyimides. Photosensitive polyimides include I line active phototosensitive polyimides based on BTDA polymers like the Ciba Geigy 412 polyimide; the G line active photosensitive polyimides based on the PMDA-ETDA/ODA copolymer like the ASAHI 6246A polyimide; G line active photosensitive polyimides based on BTDA-ODA polymers like the Toray 4840 polyimide; G line active photosensitive polyimides based on BPDA-ODA polymers based on the PIQ series of polyimides from Hitachi; and G line active photosensitive polyimides based on Pyralin chemistry from Dupont. Non-polyimide polymeric materials include benzocyclobutene-based resins, polyquinolines and fluorinated polyquinolines. It should be understood that the foregoing list of polymeric materials is for purposes of illustration and not limitation.

Another aspect of the invention is illustrated in FIG. 3. Referring to FIG. 3A, a first layer 74 of dielectric polymeric material is deposited on substrate 72 and capture pad 76. Again, for purposes of illustration and not limitation, substrate 72 is an MLC substrate. In this embodiment of the invention, polymeric material 74 is photosensitive and preferably is a photosensitive polyimide. The polymeric material is typically planarized by a simple mechanical polishing process if required. This is a function of the degree of planarization afforded by the polymer chemistry used for making the dielectric material.

Figure 3A:
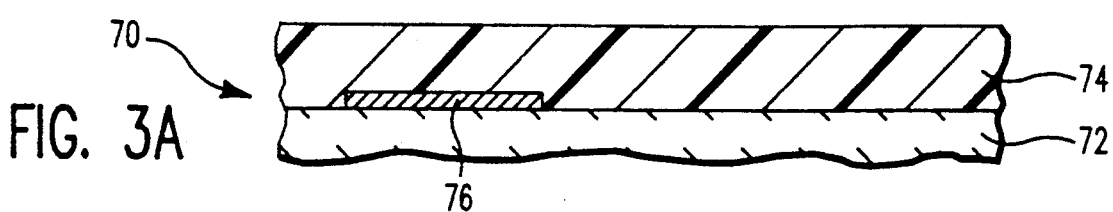
FIGS. 3A-E are a schematical representation of an alternative method of manufacturing a multilayered thin film structure according to the invention.
Figure 3B:
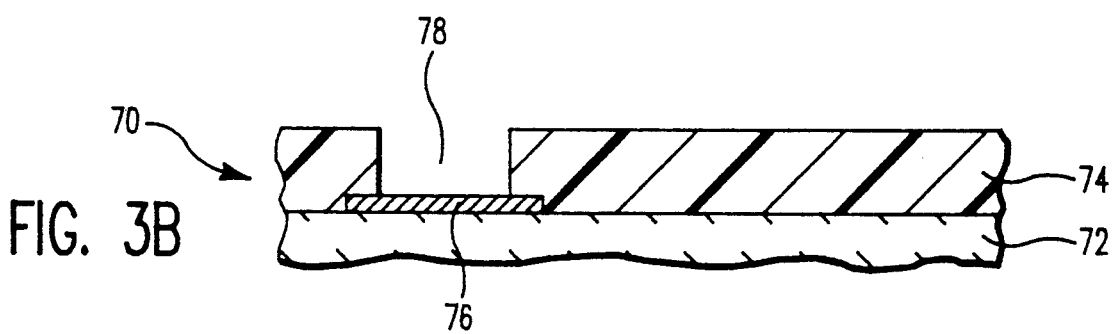

First layer 74 of polymeric material is now imagewise exposed and developed to form via opening 78 which partially exposes capture pad 76 as shown in FIG. 3B.

Figure 3C:
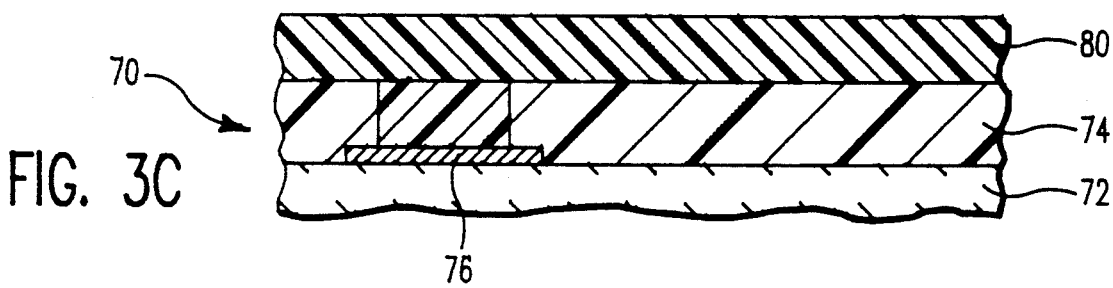

A second layer 80 of photosensitive polymeric material is then deposited over first layer 74 of photosensitive polymeric material and in via opening 78. Second layer 80 may also be planarized if desired. The resulting multilayer structure 70 so far is illustrated in FIG. 3C.

Figure 3D:
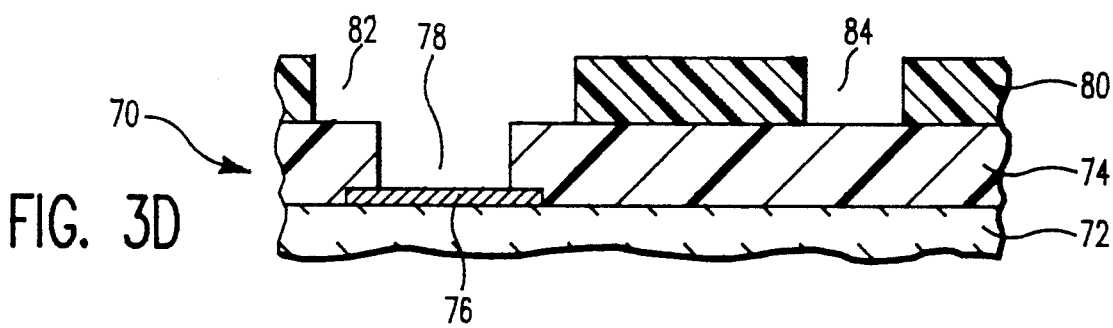

Second layer 80 of photosensitive polymeric material is then imagewise exposed and developed to form wiring openings or channels 82, 84 as shown in FIG. 3D. Again, opening 82 may be for a capture pad, engineering pad, etc. instead of for a wiring line. For purposes of illustration and not limitation, it will be assumed that opening 82 is for a wiring line.

Figure 3E:
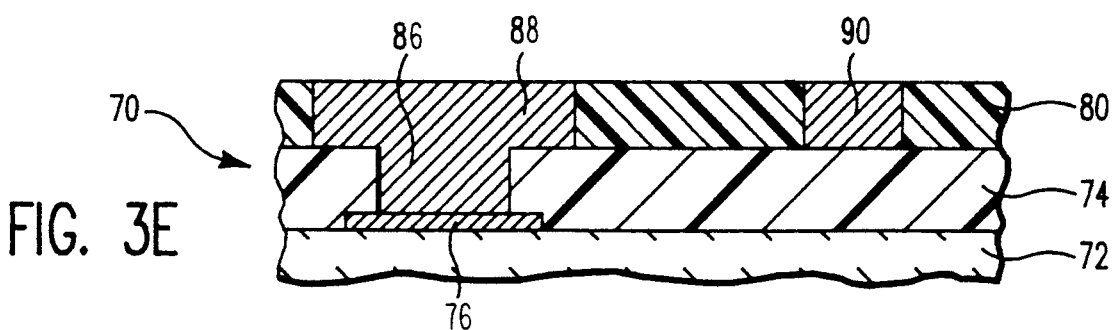

Then, as with the previous embodiment (FIG. 2E), the wiring openings or channels 82, 84 and via opening 78 are simultaneously filled with conductive material. Referring to FIG. 3E, the resulting multilayer structure 70 after planarization now contains via 86 and wiring lines 88, 90. Because of the method of the present invention, there is no interface between via 86 and wiring line 88.

The methodology of filling the multilayer structure with conductive material will now be discussed. In the prior art methods of filling a thin film multilayer structure, such as that illustrated in FIG. 1, the via openings and wiring openings or channels were typically filled by sputtering or a vacuum evaporation process. While there is nothing inherently wrong with such a process, and in fact it may be done with the present invention, the present inventors nevertheless have found it preferable to fill the multilayer structure by a plating process.

Figure 4A:
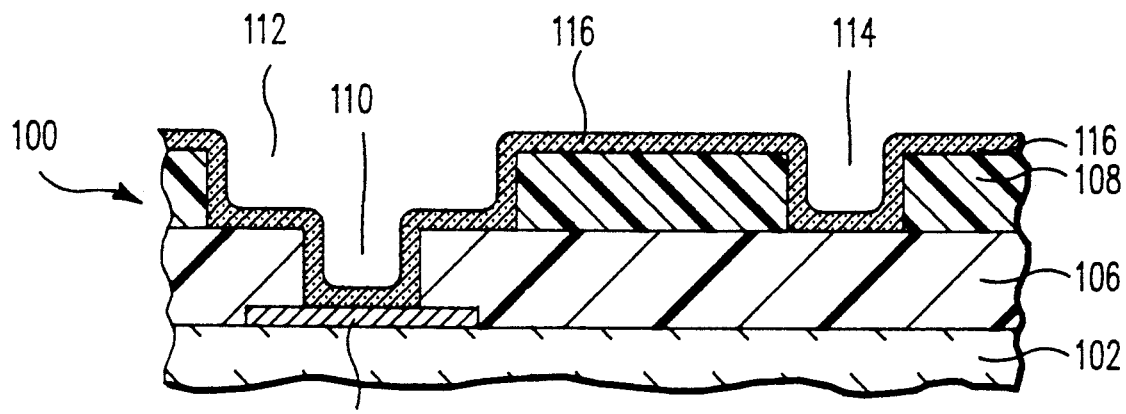
FIGS. 4A-C are a schematical representation of the preferred method according to the invention for depositing metallization in the structures of FIGS. 2D and 3D.

Referring now to FIG. 4, and more particularly referring to FIG. 4A, there is shown a multilayer structure 100 formed according to the present invention. For the purposes of the present discussion, it is unimportant whether the method illustrated in FIG. 2 or FIG. 3 is used to form the structure shown in FIG. 4A. Multilayer structure 100 comprises substrate 102, capture pad 104, first layer 106 of polymeric material and second layer 108 of polymeric material. In first layer 106, there is a via opening 110 and in second layer 108, there are wiring line openings or channels 112, 114. Wiring line opening 112 communicates with via opening 110. It is preferred that second layer 108 has been previously planarized to provide a flat, uniform surface. There is first deposited a seed layer 116 of conductive material over the surface of the second layer 108, in via opening 110 and in wiring line openings 112, 114. It is preferred that the seed layer 116 conformally and continuously coat the entire surface of the second layer 108, the via opening 110 and wiring openings 112, 114. The reason for this will become apparent shortly.

The seed layer may be formed in either of two ways. First, the seed layer may be sputtered or vacuum deposited. In this case, it is preferred that the seed layer actually comprise a chromium adhesion layer, about 200 angstroms thick, followed by about 2 microns of copper. Alternatively, the seed layer may be electrolessly plated by first electrolessly plating about 100 angstroms of a palladium adhesion layer followed by about 2000-5000 angstroms of electrolessly plated nickel or cobalt.

Figure 4B:
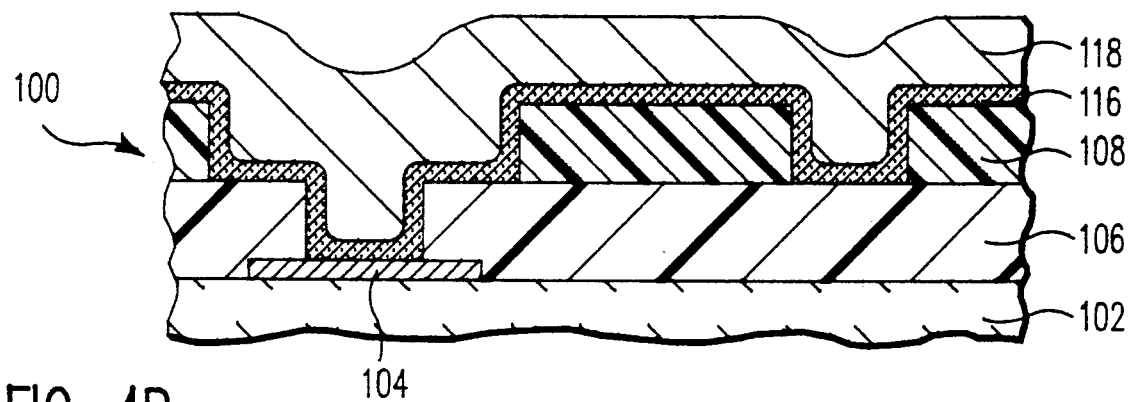
Figure 4C:
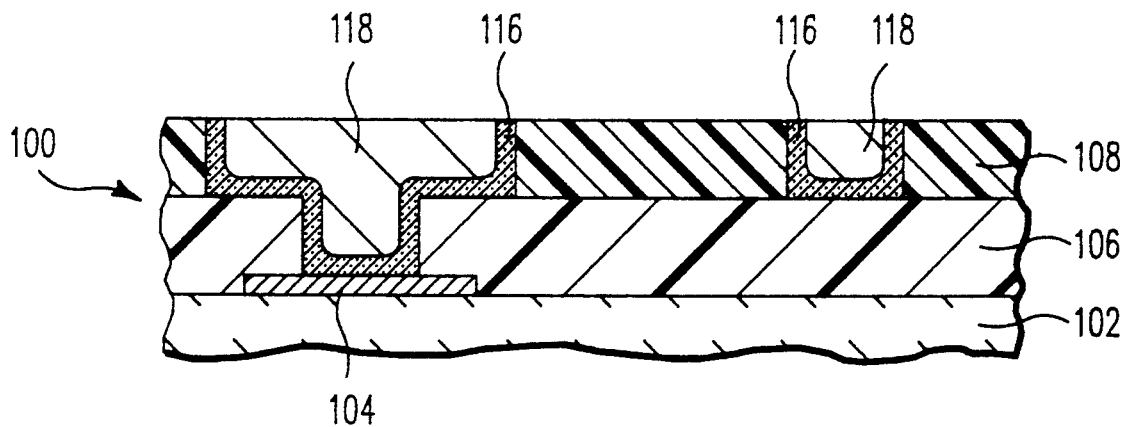

Thereafter, a relatively much thicker layer 118 of conductive material is deposited over the seed layer 116 as shown in FIG. 4B. For example, it has been found that this much thicker layer is about 17 microns thick but, of course, will vary depending on the thicknesses of the first and second layers of polymeric material. That is, much thicker layer 118 must be at least as thick (and preferably just a little thicker) as the sum of first layer 106 and second layer 108 so as to completely fill the wiring line channels 112, 114. Layer 118 may be deposited by typical sputtering or vacuum deposition processes. It is preferable, however, that the layer 118 be either electrolessly plated, or electro-plated, up on the seed layer 116. Since there is a conformal, continuous seed layer already present, it is easy then to electroplate up the thicker layer 118, which preferably is copper.

It is noteworthy that the seed layer 116 and layer 118 have been blanket deposited so that it is not necessary to mask off any areas where the metallization is not required. Removal of the unwanted metallization will occur in the next step of the process according to the present invention.

The excess or unwanted conductive material, i.e. that overlaying the second layer 108, may then be removed by a planarization process. The preferred planarization processes are chem-mech polishing and highly accurate machining techniques. These planarization techniques have been disclosed in Chow et al. U.S. Pat. No. 4,702,792, Carr et al. U.S. Pat. No. 4,954,142, Nenadic, et al. U.S. patent application Ser. No. 481,941 filed Feb. 23, 1990, and the Park et al U.S. Patent Application mentioned previously. The resulting planarized structure is that shown in FIG. 4C.

In an alternative embodiment of the invention, the multilayer structure in FIG. 4A may be planarized after deposition of the seed layer 116, thus removing the seed layer except within via opening 110 and wiring line openings 112, 114. Thereafter, much thicker layer 118 may be formed. If layer 118 is formed by electroless plating, the features may be plated up to final height. Because there is no seed layer outside of via opening 110 and wiring line openings 112, 114, the conductive material of layer 118 will only be deposited within these openings when electroless plating is used. Any excess may be removed by the above planarization techniques.

The advantages of the present invention will become more apparent after referring to the following working example.

EXAMPLE

A multilayer ceramic substrate with a plurality of capture pads was conventionally prepared in the following manner. A slurry of binders, solvents, plasticizers and crystallizable glass having as its principal crystalline phase cordierite was cast into greensheets. The crystallizable glass may be selected from that disclosed in Kumar et al U.S. Pat. No. 4,301,324. The greensheets were then dried and patterned by punching or similar means. Thereafter, the greensheets were metallized with a copper-based metallurgy, stacked, laminated and sintered to burn off the organics and densify the ceramic material. Lamination and sintering were conducted in accordance with known procedures, such as that disclosed in Herron et al. U.S. Pat. No. 4,234,367. After sintering, Cr/Cu/Cr capture pads were applied to the top surface of the substrate by a conventional metallization and subtractive etch process.

The multilayer thin film structure according to the invention was then applied to the substrate.

An adhesion promoter (A1100) was first spin applied to the surface of the substrate and then baked in an infrared (IR) oven under nitrogen at 90 degrees centigrade for 30 minutes. A BPDA-PDA type nonphotosensitive polyimide precursor was spin applied onto the A1100 and then baked for 30 minutes in an IR oven under nitrogen. The polyimide was imidized by baking at 150 degrees centigrade for 45 minutes, then at 230 degrees centigrade for 45 minutes and finally at 350 degrees centigrade for 60 minutes, all under forming gas. The total thickness of the polyimide after baking was about 13 microns.

The polyimide was planarized (by micromilling) to a final thickness of about 7 microns.

Another layer of A1100 adhesion promoter was spin applied to the top surface of the polyimide followed by a bake at 90 degrees centigrade for 30 minutes in an IR oven under nitrogen. Thereafter, a pre-imidized photosensitive polyimide (Ciba Geigy 412) was spin applied followed by baking on a hot plate set at 130 degrees centigrade for 30 minutes. The thickness of the photosensitive polyimide after baking was about 8.5 microns.

The photosensitive polyimide was exposed imagewise to actinic radiation (I-line of 365 nanometers) and then developed in NMP (N-methyl-2-pyrrolidone). The photosensitive polyimide was cured by baking in forming gas at 150 degrees centigrade for 30 minutes, then 230 degrees centigrade for 30 minutes and then 350 degrees centigrade for 120 minutes. The total thickness of the photosensitive polyimide layer after baking remained at about 8.5 microns.

At this point in the process, wiring openings or channels have been formed in the photosensitive polyimide layer.

Next, the underlying polyimide is laser ablated to form via openings in communication with the capture pads and with at least some of the wiring channels. A dielectric mask is used in conjunction with an Excimer laser to form the via openings. Laser ablation debris is removed by downstream ashing.

The Cr layer on the exposed capture pad is removed by an ion beam etch. A seed layer is next sputter deposited over the surface of the photosensitive polyimide layer, in the via openings and in the wiring channels. The seed layer comprises a 200 angstrom thick chromium adhesion layer followed by a 2 micron thick copper layer. To apply the final layer of metallurgy, the substrate was gripped with suitable electrodes and then immersed in a copper plating bath (SELREX Corporation, Nutley, N.J.) consisting of 60-80 grams/liter of copper sulphate, 150-180 grams/liter of sulphuric acid plus other additives (brightners, levellers, etc.) at a current density of 10-25 milliamps/square centimeter to plate up a total of about 17 microns of copper on the seed layer. The electrically continuous seed layer facilitated the electroplating of the copper. Also, it was not necessary to perform any masking operations.

Finally, the multilayer structure was planarized by highly accurate machining. The entire amount of metallurgy deposited on the photosensitive polyimide layer plus about 2 additional microns of polymer were removed. Micromilling was followed by a light mechanical polish.

The final structure obtained was a multilayer thin film structure having improved processability and higher yields at reduced costs, thereby meeting the advantages and object of the present invention.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method of making a planar multilayer thin film structure on the surface of a dielectric substrate comprising the steps of:
   a. forming a multilayer thin film structure comprising the steps of:
      applying a first layer of dielectric polymeric material on a surface of a dielectric substrate,
      applying a second layer of dielectric polymeric material over the first layer of polymeric material wherein said second polymeric material is photosensitive,
      imagewise exposing and developing said second polymeric material to form a feature therein, said second layer feature in communication with at least one feature formed in said first polymeric material;
   b. filling the features in the entire multilayer structure simultaneously with conductive material by first depositing a seed layer of conductive material over the surface of said second layer and in said first and second layer features, then depositing a relatively much thicker layer of conductive material over said seed layer, said features being filled to at least the same level as said second polymeric material; and
   c. planarizing said multilayer thin film structure by removing the excess of the much thicker layer of conducive material.

2. The method of claim 1 further comprising the step of forming said first layer feature subsequent to the forming of said second layer feature.

3. The method of claim 2 wherein said first layer feature forming step is by laser ablating or reactive ion etching the first layer of polymeric material.

4. The method of claim 2 wherein said first polymeric material is not photosensitive.

5. The method of claim 4 wherein said first layer of polymeric material is a polyimide or a precursor of a polyimide.

6. The method of claim 1 further comprising the step of forming said first layer feature prior to the forming of said second layer feature.

7. The method of claim 6 wherein said first layer of polymeric material is a photosensitive polyimide or a precursor of a photosensitive polyimide.

8. The method of claim 7 wherein said first layer feature forming step comprises imagewise exposing and developing said photosensitive polyimide or polyimide precursor to form a first layer feature.

9. The method of claim 1 wherein the seed layer is deposited by sputtering or vapor deposition.

10. The method of claim 9 wherein the seed layer comprises chromium followed by copper.

11. The method of claim 1 wherein the seed layer is deposited by electrolessly plating.

12. The method of claim 11 wherein the seed layer comprises palladium followed by nickel or cobalt.

13. The method of claim 1 wherein the much thicker layer of conductive material is deposited by sputtering or vapor deposition.

14. The method of claim 1 wherein the much thicker layer of conductive material is electroplated onto the seed layer.

15. The method of claim 1 wherein the much thicker layer of conductive material is electrolessly placed onto the seed layer.

16. The method of claim 1 wherein the much thicker layer of conductive material is copper.

17. The method of claim 1 wherein the step of planarizing is by a machining process.

18. The method of claim 1 wherein the step of polarizing is by a chemical-mechanical polishing process.

19. The method of claim 1 wherein:
   after first depositing a seed layer of conductive material over the surface of said second layer and in said first and second layer features, and prior to depositing the relatively much thicker layer of conductive material over said seed layer, the method further comprises removing the seed layer form the surface of said second layer but not from the first and second layer features.

20. The method of claim 19 wherein the much thicker layer of conducive material is electrolessly plated onto the seed layer.

21. The method of claim 1 wherein the substrate is a multilayer ceramic substrate.

22. The method of claim 1 wherein said second layer of polymeric material is a photosensitive polyimide or a precursor of a photosensitive polyimide.

23. The method of claim 1 wherein said first layer feature is a via.

24. The method of claim 1 wherein said second layer feature is a wiring channel.

25. The method of claim 1 wherein said second layer feature is a capture pad.

* * * * *